(12) United States Patent
Makino et al.

(10) Patent No.: US 8,460,467 B2
(45) Date of Patent: *Jun. 11, 2013

(54) VACUUM PROCESSING APPARATUS

(75) Inventors: Akitaka Makino, Hikari (JP); Youji Takahashi, Kudamatsu (JP); Minoru Soraoka, Shunan (JP); Hideki Kihara, Kudamatsu (JP); Susumu Tauchi, Shunan (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/177,076

(22) Filed: Jul. 6, 2011

(65) Prior Publication Data

US 2011/0259522 A1    Oct. 27, 2011

Related U.S. Application Data

(63) Continuation of application No. 12/034,837, filed on Feb. 21, 2008, now Pat. No. 7,976,632, which is a continuation of application No. 10/656,334, filed on Sep. 8, 2003, now Pat. No. 7,335,277.

(51) Int. Cl.
C23F 1/00        (2006.01)
C23C 16/00      (2006.01)
H01L 21/677    (2006.01)

(52) U.S. Cl.
USPC ............... 118/719; 118/723 R; 156/345.2

(58) Field of Classification Search
USPC ................................... 156/345.2
See application file for complete search history.

(56) References Cited

U.S. PATENT DOCUMENTS

| | | | |
|---|---|---|---|
| 5,685,942 A | 11/1997 | Ishii | |
| 5,772,770 A | 6/1998 | Suda et al. | |
| 6,051,281 A | 4/2000 | Kobayashi et al. | |
| 6,062,798 A | 5/2000 | Muka et al. | |
| 6,143,082 A | 11/2000 | McInerney et al. | |
| 6,277,199 B1 | 8/2001 | Lei et al. | |
| 6,286,230 B1 | 9/2001 | White et al. | |
| 6,312,525 B1 * | 11/2001 | Bright et al. | 118/719 |
| 6,558,506 B1 | 5/2003 | Freeman | |
| 2001/0006094 A1 * | 7/2001 | Amano et al. | 156/345 |
| 2004/0050327 A1 | 3/2004 | Johnson et al. | |

FOREIGN PATENT DOCUMENTS

| | | |
|---|---|---|
| JP | 05-160026 | 6/1993 |
| JP | H 06-267808 | 9/1994 |
| JP | 8-78392 | 3/1996 |
| JP | 08-127861 | 5/1996 |
| JP | 5-160031 | 6/1996 |
| JP | 10-183353 | 7/1998 |
| JP | 10-214117 | 8/1998 |
| JP | 2000-306847 | 11/2000 |
| JP | 2001-509646 | 7/2001 |
| JP | 2002-231648 | 8/2002 |
| JP | 2003-060005 | 2/2003 |
| WO | WO 99/03133 | 1/1999 |

* cited by examiner

*Primary Examiner* — Parviz Hassanzadeh
*Assistant Examiner* — Nathan K Ford
(74) *Attorney, Agent, or Firm* — Antonelli, Terry, Stout & Kraus, LLP.

(57) ABSTRACT

A vacuum processing apparatus includes a transfer unit disposed at a center thereof, plural processing chambers, each processing chamber having a processing table for supporting an object to be processed and carrying out processing using a gas, and a mass flow controller unit interposed between two of the processing chambers for supplying gas to the chambers.

15 Claims, 10 Drawing Sheets

VACUUM PROCESSING APPARATUS

CROSS REFERENCE TO RELATED APPLICATION

This application is a continuation of U.S. application Ser. No. 12/034,837, filed Feb. 21, 2008, now U.S. Pat. No. 7,976,632, which is a continuation of U.S. application Ser. No. 10/656,334, filed Sep. 8, 2003, now U.S. Pat. No. 7,335,277, the contents of which are incorporated herein by reference. This application relates to U.S. Ser. No. 10/812,087, filed Mar. 30, 2004, now U.S. Pat. No. 7,247,207, which is a continuation of U.S. application Ser. No. 10/656,334, filed Sep. 8, 2003 and relates to U.S. Ser. No. 10/812,086, filed Mar. 30, 2004, now abandoned, which is a continuation of 10/656,334, filed Sep. 8, 2003.

FIELD OF THE INVENTION

The present invention relates to a vacuum processing apparatus for treating an object inside a decompressed apparatus, and especially relates to a vacuum processing apparatus for processing a semiconductor substrate (wafer) using plasma generated within the apparatus.

DESCRIPTION OF THE RELATED ART

In the field of vacuum processing apparatuses, especially vacuum processing apparatuses for treating objects within a decompressed chamber, there are increasing demands for enhancing the preciseness of microfabrication of the processes and for improving the efficiency for processing the object wafer. Thus, in recent years, a multiple chamber-type vacuum processing apparatus has been developed in which multiple processing chambers are connected to a single transfer unit, allowing various processes to be performed to the object wafer within a single vacuum processing chamber and thereby improving process efficiency.

According to the vacuum processing apparatus comprising multiple processing chambers for carrying out various processes, each processing chamber is connected to a transfer chamber (transfer unit) capable of having its inner pressure decompressed or having appropriate gases introduced thereto and equipped with a robot arm or the like for transferring wafers.

According to such arrangement, the wafer either before or after being subjected to processing is transferred from one processing chamber to another processing chamber via a transfer chamber having decompressed pressure or having inert gas introduced thereto, so the wafer can be subjected to multiple processes continuously without being exposed to outside air. Thus, contamination of the wafer is suppressed, and the yield and the efficiency of the processes are thereby improved.

Moreover, since the time required for increasing and decreasing the pressure within the processing chamber and the transfer chamber can be cut down or even eliminated, the number of steps required for processing is reduced, the time and work required for the overall processing of the wafer is cut down, and the process efficiency is improved.

According to such vacuum processing apparatuses, the multiple processing chambers can be detached independently from the transfer chamber, so that the apparatus can be prepared to correspond to new processes by rearranging the processing chambers and the components thereof without having to replace the whole apparatus body. As a result, the cost for manufacturing products using the vacuum processing apparatus is cut down.

A conventionally known vacuum processing apparatus in which processing chambers are detachably attached is disclosed for example in patent document 1 (Japanese Patent Laid-Open Publication No. 6-267808), in which various processing chambers for treating a semiconductor wafer are connected detachably onto a wafer transfer chamber, a transfer stage capable of moving in the X, Y or Z-axis direction is disposed below each of the processing chambers, and the position in which each processing chamber is mounted to the wafer transfer chamber is adjusted by the movement of the stage. The construction of such prior art apparatus facilitates the positioning of each processing chamber with respect to the transfer chamber, and simplifies the operation for attaching and detaching the chambers.

However, the prior art apparatus suffered the following drawbacks. When multiple processing chambers are disposed adjacent one another, the size of each unit attached to or detached from the apparatus becomes large due to the guiding mechanism including the transfer stage disposed to the lower portion of the apparatus, and therefore, the footprint of the whole vacuum processing apparatus is enlarged. Consequently, the number of apparatus that can be installed in a certain area, for example, a clean room, is reduced, and the fabrication efficiency of products manufactured by operating a plurality of apparatuses is thus deteriorated. However, there were no considerations related to overcoming this problem in the prior art.

It may be possible to reduce the footprint of the apparatus by miniaturizing the guiding mechanism, by which the spaces interposed between the multiple processing chambers are minimized. However, this causes another drawback in that the space for carrying out maintenance operations or connecting and disconnecting of processing chambers is reduced, which leads to deterioration of the operation efficiency and longer work time, increase of non-operation time during which the operation of the apparatus is stopped, deterioration of operation efficiency of the vacuum processing apparatus, and increase of manufacturing costs.

Moreover, there were considerations in the prior art related to facilitating the connection of the processing chambers with the transfer chamber, but there were no considerations on facilitating the connection and disconnection of various apparatuses used in the processing chamber, such as the supply and exhaust mechanisms of processing gas and air, or supply mechanisms of power and refrigerant. In other words, according to the prior art, there were no considerations on improving the operation efficiency upon attaching and detaching processing chambers other than facilitating the positioning thereof, and as a result, long work time was required and the operation efficiency of the vacuum processing apparatus was deteriorated.

Furthermore, the prior art lacks consideration on how to realize a predetermined performance in each processing chamber in a stable manner after attaching the chamber to the apparatus. That is, after attaching a processing chamber that has a different construction from the processing chamber attached previously, each processing chamber being newly attached must be subjected to an adjustment procedure after attachment so as to realize determined performance, according to which the time required after attachment and detachment or during maintenance is extended, and thus the operation efficiency of the vacuum processing apparatus is deteriorated.

Even further, according to the above-mentioned prior art apparatus, when one processing chamber is subjected to maintenance or being attached or detached, the other processing chambers connected to the wafer transfer chamber cannot perform processing. Thus, during maintenance or attachment and detachment of a certain processing chamber, the whole vacuum processing apparatus stops operating even though other processing chambers are prepared for processing. Therefore, the operation efficiency of the vacuum processing apparatus is significantly deteriorated, but the prior art lacks to provide any measures against this problem.

Moreover, upon carrying out maintenance and other operation of the interior of the processing chamber, the pressure within the chamber must be substantially equalized with the ambient pressure, and after completing the operation, the processing chamber must be decompressed for processing. If the time required for increasing and decreasing pressure in the processing chamber is long, then the time for carrying out the processing in the chamber is relatively reduced, so the operation efficiency of the vacuum processing chamber is deteriorated and the fabrication cost of the product is increased. The prior art also lacks to consider this problem.

SUMMARY OF THE INVENTION

The object of the present invention is to provide a vacuum processing apparatus that is small in size with a small footprint.

Another object of the present invention is to provide a vacuum processing apparatus in which the operations related to maintenance and the connecting or disconnecting of components are facilitated.

Yet another object of the present invention is to provide a vacuum processing apparatus having an improved operation efficiency.

In order to solve the above-mentioned problems of the prior art, the present invention provides a vacuum processing apparatus comprising a transfer unit disposed at a center thereof; plural processing chambers, each processing chamber having a processing table for supporting an object to be processed and carrying out processing using a gas; and a mass flow controller interposed between two processing chambers for supplying gas to the chambers.

Furthermore, the present invention provides a vacuum processing apparatus comprising plural processing chambers, each processing chamber having a processing table for supporting an object to be processed and carrying out processing using a gas in plasma state; and a high frequency power source used for turning the gas into plasma.

The present invention further provides a vacuum processing apparatus comprising plural processing chambers, each processing chamber having a processing table for supporting an object to be processed and carrying out processing using a gas, wherein a connector portion between the vacuum processing apparatus and a building in which the apparatus is installed for supplying from the building utilities such as gas, water and air to the vacuum processing apparatus and discharging exhaust and the like from the apparatus is disposed in a line under an entry port for transferring the object into vacuum.

The present invention further provides a vacuum processing apparatus comprising a vacuum processing chamber having a processing table for supporting an object to be processed and carrying out processing using a gas, the vacuum processing chamber having an axisymmetric structure, wherein the vacuum processing chamber has a double wall structure and comprises a gate valve for sealing an opening through which the object enters the processing chamber.

Moreover, the present invention provides a vacuum processing apparatus comprising a vacuum processing chamber having a processing table for supporting an object to be processed and carrying out processing using a gas, the vacuum processing chamber having an axisymmetric structure with respect to the object to be processed, wherein the vacuum processing chamber has a double wall structure and comprises a gate valve for sealing an opening formed to the chamber wall through which the object enters the processing chamber; and the shape of the gate valve for sealing the opening formed to the inner vacuum processing chamber wall is determined so that it does not interfere with the axisymmetric structure of the vacuum processing chamber.

The present invention further provides a vacuum processing apparatus comprising a vacuum processing chamber having a processing table for supporting an object to be processed and carrying out processing using a gas, the vacuum processing chamber having an axisymmetric structure with respect to the object to be processed, wherein the vacuum processing chamber has a double wall structure and comprises a gate valve for sealing an opening formed to the chamber wall through which the object enters the processing chamber; and an inner vacuum processing chamber has a wall divided into two portions, an upper portion and a lower portion, with the processing table interposed between the two portions.

DETAILED DESCRIPTION OF THE PREFERRED EMBODIMENT

The preferred embodiment of the present invention will now be explained in detail with reference to the accompanying drawings.

Figure 1:
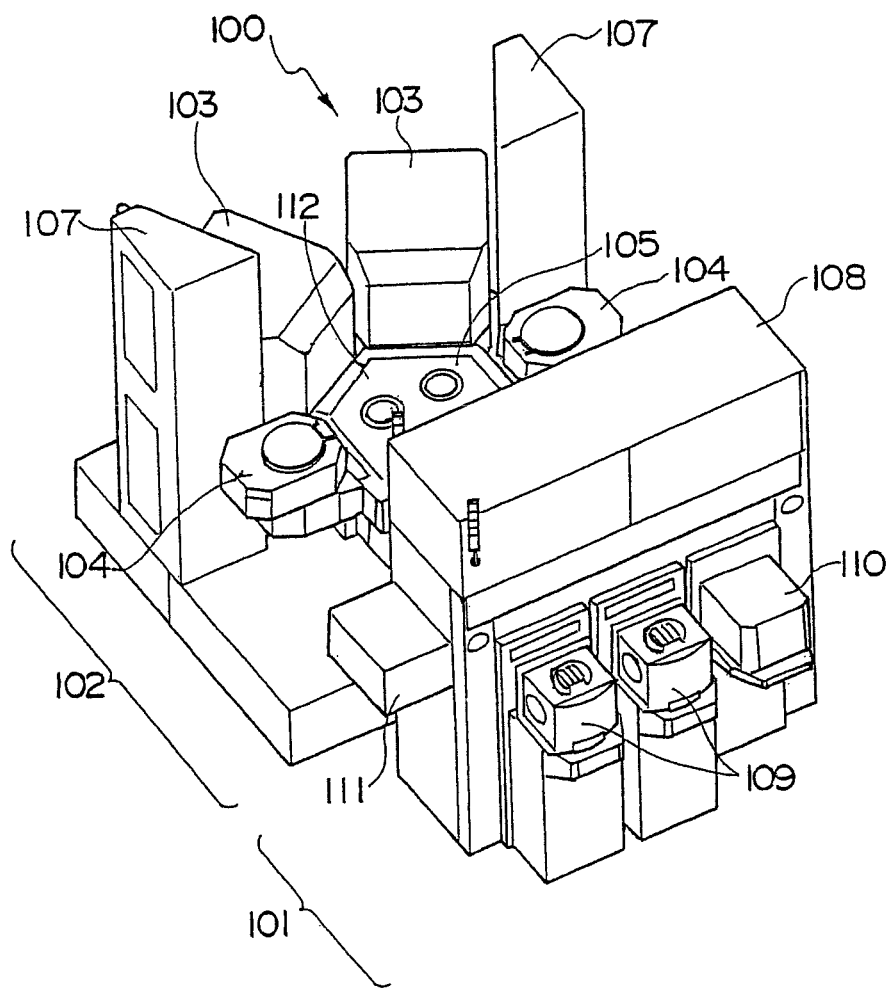
FIG. 1 is a perspective view showing the overall structure of a vacuum processing apparatus according to the preferred embodiment of the present invention.
Figure 1:
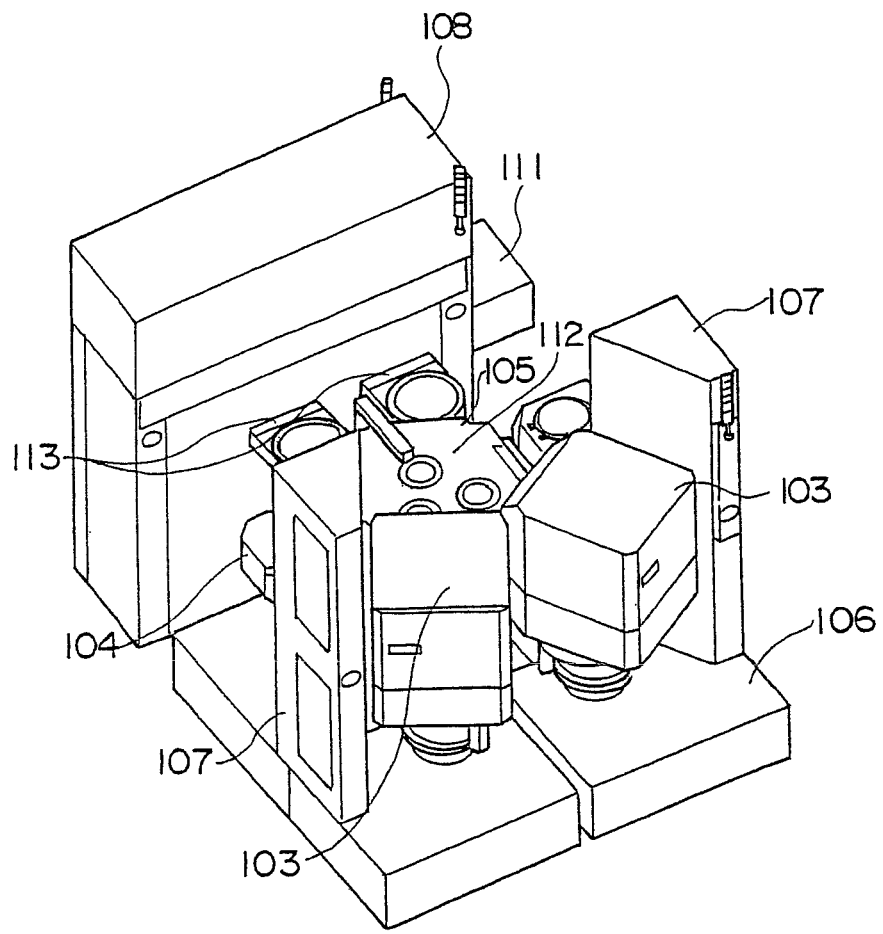

FIG. 1 is a perspective view showing the overall structure of a vacuum processing apparatus according to a preferred embodiment of the present invention. FIG. 1(a) is a perspective showing the front side, and (b) is a perspective showing the back side thereof. In this drawing, a vacuum processing apparatus 100 according to the present embodiment is largely divided into two, front and back, blocks. The front side of the vacuum processing apparatus body 100 is an atmospheric block 101 in which a wafer supplied to the apparatus is transferred to a chamber decompressed under atmospheric pressure and supplied to a processing chamber. The rear side of the apparatus body 100 is composed of a processing block 102. The processing block 102 comprises processing units 103 and 104 having processing chambers being decompressed for processing wafers, a transfer unit 105 for transferring wafers to these processing chambers under reduced pressure, and plural lock chamber units 113 for connecting the transfer unit 105 with the atmospheric block 101, these units capable of being decompressed and maintained at high degree of vacuum, so the processing block is a vacuum block.

The atmospheric block 101 comprises a box 108 having a transfer robot (not shown) disposed within, a wafer cassette 109 in which wafers for processing or cleaning are stored and a dummy cassette 110 storing dummy wafers disposed on the box 108. The transfer robot transfers wafers stored in these cassettes 109, 110 to a lock chamber unit 113, and vice versa. The atmospheric block 101 further comprises a positioning unit 111 disposed on the box 108, and within this positioning unit 111, the transferred wafer is adjusted of its position appropriately for the wafer location in the cassette 109 or 110, or in the lock chamber unit 113.

As for the processing units 103 and 104 in the processing block 102, the processing unit 103 is an etching unit equipped with an etching chamber for etching the wafer transferred into the processing block from the cassette 109, and the processing unit 104 is an ashing unit for providing an ashing treatment to the wafer transferred thereto. The transfer unit is equipped with a transfer chamber 112 capable of being decompressed to high degree of vacuum and maintaining the vacuum state, and to which the processing units 103 and 104 are detachably connected. Further, the processing block 102 comprises a control unit 107 including a mass flow controller for controlling the feeding of gas and fluid required in the units or processing chambers, the control unit 107 disposed between and adjacent to the processing units 103 and 104.

At the lower area of the processing block 102 is disposed a frame 106 storing a rectangular bed for storing necessary utilities corresponding to each of the processing units such as storage and exhaust units of gases and refrigerants or power sources for feeding power. The processing chamber portion of the processing units 103, 104, the control units 107 and the bed are detachably disposed on the frame 106.

Figure 2A:
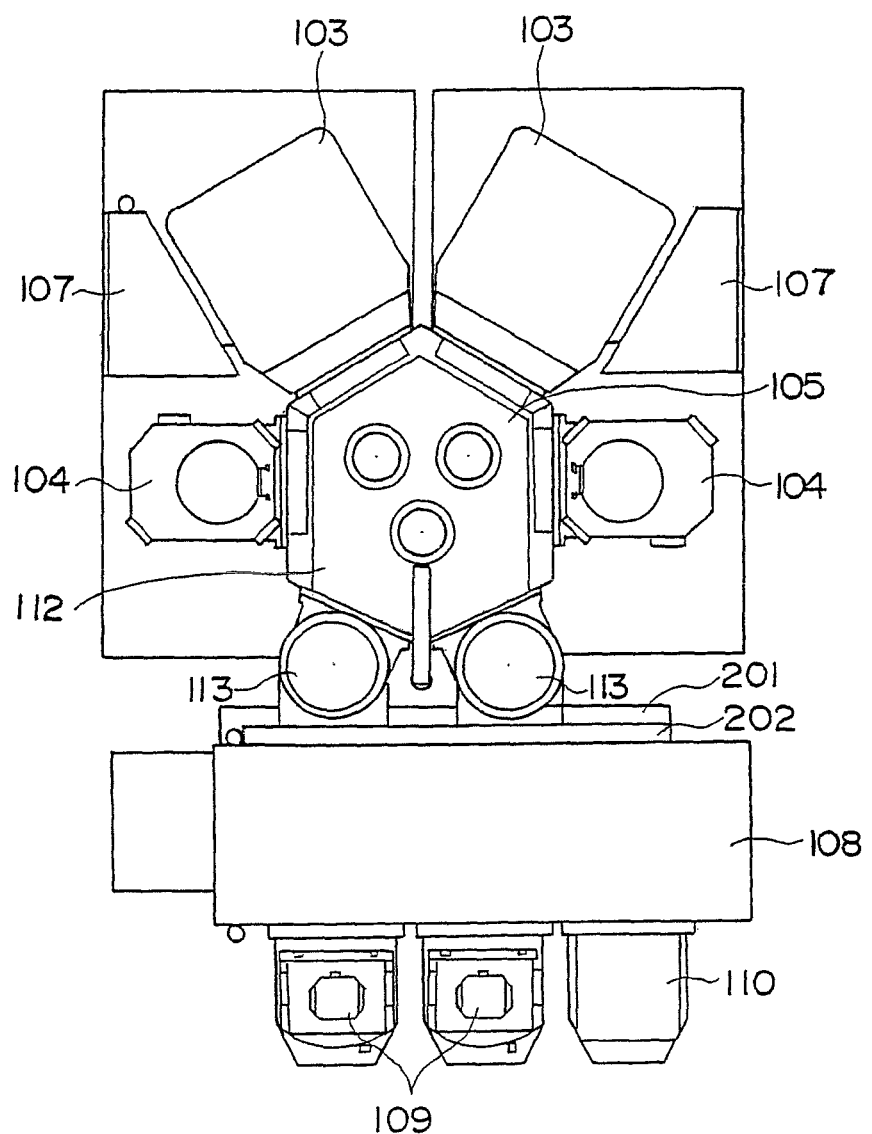
FIG. 2 is a plan view showing the outline structure of the vacuum processing apparatus according to the embodiment of the present invention.
Figure 2:
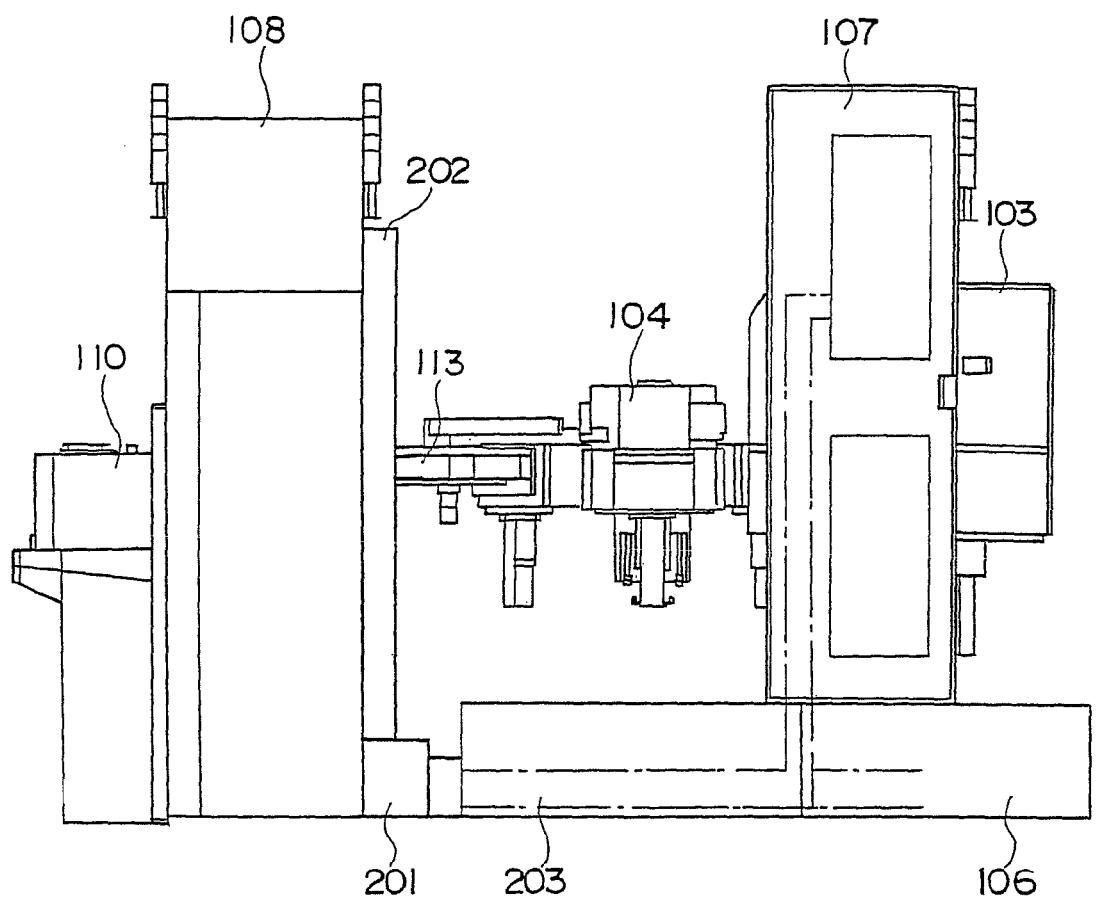
Figure 3A:
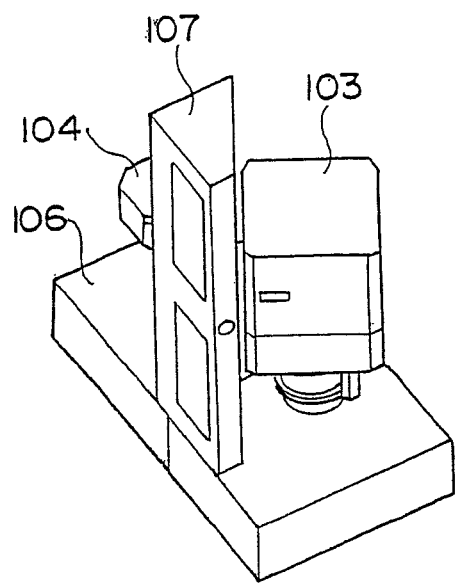
FIG. 3 is a perspective view showing the outline structure of each unit of the vacuum processing apparatus according to the embodiment of the present invention.
Figure 3B:
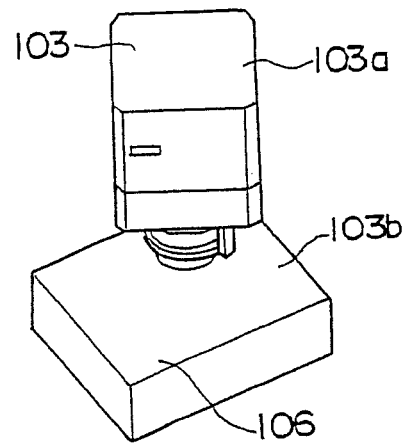
Figure 3C:
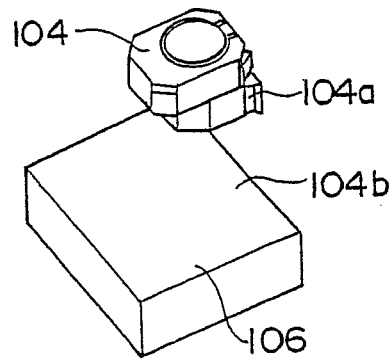
Figure 3D:
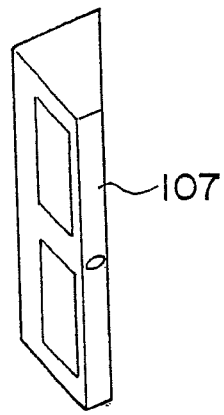

FIG. 2 is a view showing the outline of the structure of the vacuum processing chamber 100 according to the embodiment of FIG. 1, in which FIG. 2(a) shows a plan view from above, and FIG. 2(b) shows the view from the side. In these drawings, the atmospheric block 101 disposed on the front side of the vacuum processing apparatus body 100 is for handling (transferring, storing, positioning etc.) the wafers under atmospheric pressure, and the processing block 102 disposed on the rear side of the apparatus body 100 is for transferring and processing wafers under a pressure decompressed from atmospheric pressure and for increasing and decreasing pressure while wafers are disposed therein.

Each lock chamber unit 113 connects the atmospheric block 101 with the transfer chamber 112 of the transfer unit 105, the chamber 113 having connected thereto a gas exhaust unit and a gas supply unit for increasing and decreasing the inner pressure of the lock chamber 113 having disposed in its interior the transferred wafer, and for Maintaining a controlled pressure. Thus, the lock chamber unit 113 is equipped with gate valves disposed on its front and rear ends that can be opened and closed, enabling the lock chamber to be sealed in airtight manner. The lock chamber unit 113 further comprises a wafer holder for supporting a wafer, and a means for fixing the wafer to position during increase and decrease of inner pressure of the chamber. In other words, the lock chamber unit 113 is equipped with means for sealing the chamber while a wafer is disposed therein, the sealing means capable of bearing the pressure difference between the inside and outside of the chamber.

As explained, the transfer unit 105 is composed of a transfer chamber 112 with reduced inner pressure and having a robot arm (not shown) disposed therein for transferring wafers between processing chambers 103, 104 and the lock chamber unit 113, and multiple lock chambers 113.

According to the present embodiment, as for processing units 103 and 104, two etching units and two ashing units are respectively connected to and disposed on each side of a polygonal transfer chamber 112 of the transfer unit 105, in which two etching units 103 are disposed on two sides of the transfer chamber 112, and two ashing units 104 are each disposed on the side adjacent to the etching units 103. Lock chamber units 113 are connected to the remaining sides of the transfer chamber. In other words, the present embodiment comprises two etching chambers and two ashing chambers.

According further to the present embodiment, the processing units 103 and 104 are connected to the transfer unit 105 in a detachable manner, and the lock chamber units 113 and the transfer chamber 112 are also detachably disposed in the transfer unit 105. Each of the processing units 103 and 104 can be conceptually divided into upper and lower areas, the upper area being the chamber portion containing the processing chamber, and the lower area being the bed portion storing utilities corresponding to the specific processing chamber.

The bed portion is a substantially rectangular body storing utilities, a controller, a heat exchanger etc. required for the chamber unit located above. Examples of utilities include an air pump for reducing the pressure of the processing chamber, a power source for supplying power, a gas storage portion for feeding gas to a wafer holder having a wafer (sample) mounted thereon and fixed thereto in the processing chamber, a refrigerant storage for cooling the wafer holder, and a heat exchanger of a refrigeration cycle for performing heat exchange of the refrigerant and cycling the same. The bed stores these utilities, the bed being stored in and connected to the frame 106 disposed below the chamber unit. A side of one rectangular bed faces to a side of another rectangular bed next to it. Beds for four processing units, in this embodiment, are composed and disposed shaping a substantially large rectangle. A width of the large rectangle is not larger than a width of the box 108 of the atmospheric block.

The chamber unit is connected to the corresponding sides of the transfer chamber 112 via a predetermined connecting gate. Furthermore, the bed unit corresponding to the chamber unit is stored in the frame 106 disposed under the transfer chamber 112 and connected to the vacuum chamber apparatus body 100. The frame 106 further stores an interface unit required for driving the various utilities stored in the bed.

According to the present embodiment, a combination of a processing chamber unit and a corresponding bed unit constitutes one processing unit. A single processing unit is connected as one unity to the apparatus body 100 or the transfer unit 105 (transfer chamber 112) in a detachable fashion. Within a single processing unit, the processing chamber can be connected to the transfer unit 105 while the corresponding bed portion is attached thereto or detached therefrom, and conversely, the bed portion can be connected to the frame 106 while the upper processing chamber can be attached thereto or removed therefrom.

At the rear side of the atmospheric block 101 in the space interposed between the processing block 102 are disposed lock chamber units 113, and a gap is formed between the rear side and the frame 106 or between each bed. The rear side surface of the atmospheric block 101 is used as a supply route for supplying gas, refrigerant, power etc. to the processing block. The present vacuum processing apparatus 100 is typically disposed inside a room with purified air, such as a clean room, but when plural apparatuses are to be disposed, generally the sources for various gases, refrigerants and power to be supplied to the apparatus bodies 100 are disposed on a different floor from where the apparatuses are installed, and fed to each apparatus via pipes. In the present embodiment, a connection interface 201 for connecting supply lines such as pipes for gases and refrigerants from separate locations or lines from the power sources is disposed on the rear side portion of the atmospheric block. In other words, a connector portion between the vacuum processing apparatus and the building in which the apparatus is installed for supplying from the building utilities such as gas, water and air to the apparatus and discharging exhaust from the apparatus is disposed substantially linearly under an entry port for transferring the wafer into vacuum.

The supply routes for various utilities being connected via the connection interface unit 201 to the supply path and extending to the processing block 102, that is, the supply lines of pipes and power lines extending from the connection interface unit 201, pass below the lock chamber unit 113 and below the center area of the transfer chamber 112, and via an interface unit disposed on the frame 106 and connected to each of the beds.

According to the prior art apparatuses, the pipes and power lines from a supply source disposed on a separate floor were introduced separately to the processing chambers, so the connecting and disconnecting of the pipes etc. during maintenance of the processing chamber or during replacement of apparatuses required complicated work, and the work efficiency was deteriorated. Further, display means such as meters for displaying the status of flow of the pipes and power lines and means for controlling the same were provided to each of the processing chambers, so it was not easy for the operator to check the operation status of the apparatuses. Moreover, since these pipes were disposed surrounding the processing chambers, the footprint of the overall apparatus was substantially increased thereby, and the number of apparatuses that can be disposed on one floor was reduced, or the space for carrying out maintenance and other operations was reduced and the work efficiency was deteriorated.

According to the present embodiment, the prior art problems are solved according to the above-explained arrangement in which sufficient work space is secured, operation status is easily confirmed, and footprint of the apparatus is cut down. On the rear side of the box 108 is disposed a display unit 202 comprising a sensor for detecting the status of each supply line connected to the connection interface 201 and extending toward the processing block 102 and display means for displaying the result of sensor output so that the user can confirm the operation status of the apparatus easily. Further, it is possible to dispose a control means for controlling the supply through each supply line or to enter an order to control the same.

A gap is formed between the rear surface of the box 108 and the fame 106 of the processing block 102, this gap providing a space in which a user can enter and work on the processing units 104, the transfer chamber 112 and the lock chamber 113, and also providing a space in which the user can confirm the display 202 on the rear of the box 108 and the connection interface unit 201 or enter orders via the control means etc. Further, means for controlling and displaying information on the operation of apparatuses related to the supply lines are collectively disposed in this space. Thus, the work related to operating the apparatus is facilitated, and the operation efficiency of the apparatus is improved.

Moreover, according to the present embodiment, the supply lines for supplying utilities required in units of the processing block 102 are disposed collectively. By disposing the power lines and pipes extending from a different floor, such as one floor below the floor on which the apparatus is installed, on the rear surface of the box 108 collectively, the work related to the attaching, connecting and removing of supply lines during installation of the apparatus body 100, maintenance operation of the apparatus or the replacement of equipments is facilitated, and the work efficiency is thereby improved.

Furthermore, according to the present embodiment, the supply lines such as power lines and pipes from the connection interface unit 201 is extended below the lock chamber 113 and the center area of the transfer chamber 112, and via an interface unit disposed on the frame 106 to each bed, but the supply lines such as the pipes and power lines from the connection interface unit 201 can be connected directly to the equipments stored in the bed of the frame 106.

Moreover, a supply path 203 from the connection interface unit 201 is disposed so as to extend from the rear side of the atmospheric block 101 and below the lock chamber unit 113 and the transfer chamber 112. Especially, the supply path 203 is collectively passed through the space formed between the beds under the transfer chamber 112, and connected to each bed or frame 106. In other words, the space formed by plural units surrounding the transfer chamber 112 and in which the supply path 203 is disposed is placed at the inner side or center area of the apparatus.

This space for disposing the supply path is located below the transfer chamber 112 and lock chamber unit 113, and interposed between the beds of the processing units. Thus, space for mounting, connecting or disconnecting the supply path 203 can be secured, the work related thereto is facilitated and the work efficiency improved, so as a result, the overall operation efficiency of the apparatus is improved.

Further, since the connecting portions of the utilities are disposed in the inner side of the apparatus, that is, in the space below the transfer chamber 112 and interposed between beds, the space required for working on the connecting portions is minimized, the footprint of the apparatus system is reduced compared to the case in which supply lines and connectors are disposed around the apparatus, and the number of apparatuses that can be installed in one unit floor area is increased.

FIG. 3 is a perspective view showing the outline of the structure of each unit. FIG. 3(a) illustrates the combined status of the processing units. On the other hand, FIGS. 3(b), (c) and (d) illustrate the units separately. FIG. 3(b) shows the etching unit 103, FIG. 3(c) shows the ashing unit 104, and FIG. 3(d) shows the control unit including a MFC (mass flow controller).

As illustrated, the processing units 103 and 104 respectively comprise a processing unit 103a or 104a in the upper area and a bed portion 103b or 104b in the lower area stored in and connected to a frame 106. In the space formed between the processing portion 103a and the bed 103b of the etching unit 103 are disposed pipes and lines communicated between 103a and 103b through which gases, cycled refrigerant and power are supplied, and the processing unit 103a is supported above the bed portion 103b by plural support beams not illustrated disposed on the frame 106. Similarly, in the space formed between the processing portion 104a and the bed portion 104b of the ashing unit 104 are disposed pipes and lines communicated between 104a and 104b through which gases, cycled refrigerant and power are supplied, and the processing unit 104a is supported above the bed portion 104b by plural support beams not illustrated disposed on the frame 106.

As illustrated, the control unit 107 is disposed between the etching unit 103 and the ashing unit 104, and mounted on the frame 106 above the bed units 103b and 104b of these units. The control unit 107 is for controlling the supply of necessary gases etc. to the processing units located adjacent thereto. For example, a flow controller disposed inside the control unit 107 controls the flow of gas or supply of power to the processing chamber disposed inside the processing unit 103a of the etching unit 103.

Figure 4:
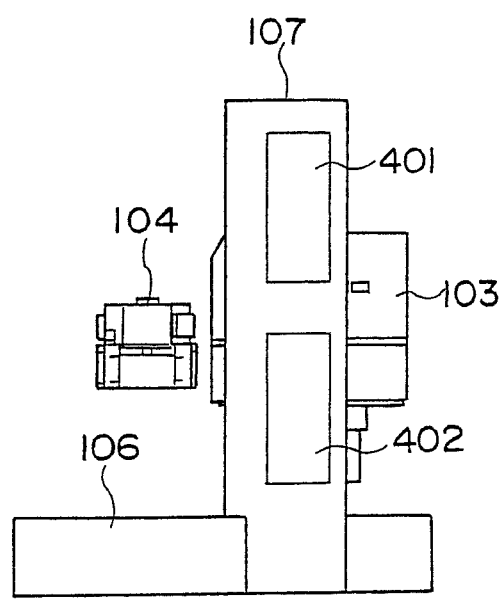
FIG. 4 is a side view showing the positional relationship between the control unit and each processing units according to the embodiment of FIG. 1.

FIG. 4 is a side elevational view showing the locational relationship of the control unit 107 and the processing units according to the embodiment of FIG. 1. The control unit 107 is located between the etching unit 103 and ashing unit 104. Inside the control unit 107 is disposed a controller (for example, MFC) for controlling the supply of gases etc. to the processing units.

In the present embodiment, plural flow controllers are disposed within the control unit 107 for controlling the amount and rate of flow of processing gases to be supplied to the etching unit 103 and the ashing unit 104 and the gas or refrigerant used for controlling the temperature of the wafer or wafer holder within the chamber. Especially, the flow controller for the etching unit is disposed on the upper area and the flow controller for the ashing unit is disposed on the lower area within the control unit 107. Upper and lower access doors 401 and 402 are disposed on the control unit 107 enabling access to the devices equipped within the control unit including these flow controllers, for maintenance and replacement of the devices.

For example, storage units for gases and fluids (refrigerant, water etc.) to be supplied to the processing chambers, valves for controlling the flow of gases and fluids, and motors for driving the valves are stored in the control unit. Such controllers are prepared for each processing chamber. The reason for this is as follows. The processing units of the present embodiment are removably attached to the transfer chamber 112 or the vacuum processing apparatus body 100, and a single apparatus 100 comprises multiple processing units capable of carrying out various processes for treating wafers. By preparing processing units having different specifications for carrying out different processes, and by replacing the processing units, a wide variety of processes can be carried out using a single apparatus. Independent control for each processing unit must preferably be implemented so as to realize the best process conditions and operation conditions of the apparatus in response to the various processing units having different specifications of processes such as different gases and different temperature being used.

According to such a vacuum processing apparatus, the control unit 107 of the present embodiment is disposed between two processing units, and formed so that it can be easily connected to the units. Thus, the attaching and detaching of processing units or control units of the apparatus is facilitated, and the work time is cut down.

The group of equipments corresponding to each processing unit is disposed vertically within the control unit 107, reducing the required space for disposing equipments. The effective use of space interposed between processing units enables distance between processing units to be minimized and overall footprint of the apparatus to be cut down. It also enables the difference between lengths of fluid flow paths supplied to the processing chambers to be reduced. Thus, difference in flow path lengths to the processing chamber before and after replacement of the processing unit or processing chamber is suppressed.

Thus, the present embodiment suppresses any difference in performance of the apparatus before and after replacement or maintenance of units, facilitating the user of the control to be performed via the control unit 107, and improving the yield factor of the overall processing apparatus.

Figure 5:
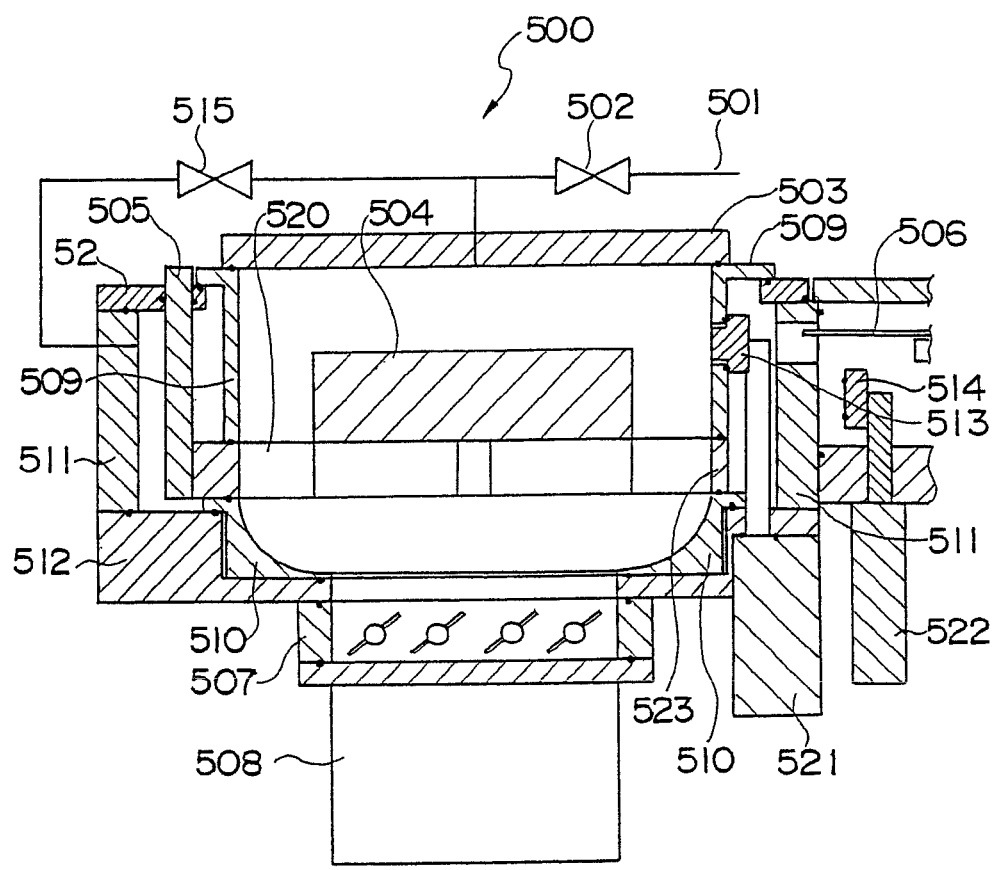
FIG. 5 is a vertical cross-sectional view showing the outline structure of the processing chamber in the processing unit according to the embodiment of FIG. 1.
Figure 6:
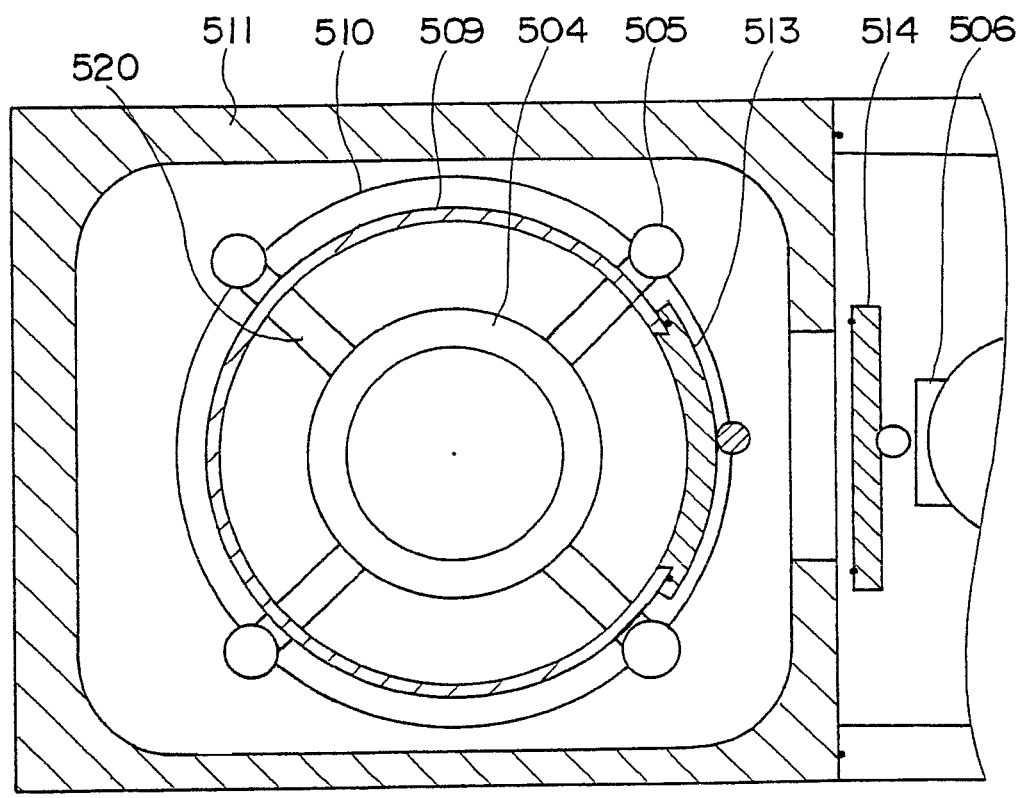
FIG. 6 is a horizontal cross-sectional view showing the outline structure of the processing chamber illustrated in FIG. 5.

FIG. 5 is a vertical cross-sectional view showing the outline of the structure of the processing chamber in the processing unit according to the embodiment of FIG. 1. FIG. 6 is a horizontal cross-sectional view of FIG. 5, taken at a horizontal plane at the gate portion. FIGS. 5 and 6 especially illustrate the structure of the processing chamber of the etching unit 103. In these drawings, the processing chamber portion 500 is connected to the transfer chamber 112, and an atmospheric gate valve 514 disposed between the processing chamber 500 and the transfer chamber 112 opens or closes the communication path. With this atmospheric gate valve 514 opened, the space inside the transfer chamber 112 is communicated with the space inside the processing chamber 500 and the pressure of both spaces become substantially equal.

While the atmospheric gate valve 514 is opened, the wafer is transferred from the transfer chamber 112 onto a wafer holder 504 disposed within the processing chamber. According to the present embodiment, after detecting and confirming that the wafer is mounted on the wafer holder 504, the atmospheric gate valve 504 is closed to shut the communication of the processing chamber 500 and the transfer chamber 112, thereby sealing the processing chamber to start the processing.

When the processing chamber 500 is to be detached from the transfer chamber 112, or when performing maintenance of the chamber 500, the atmospheric gate valve 512 is closed and then the pressure inside the processing chamber 500 is increased to atmospheric pressure, before outer chambers 511 and 512 defining the vacuum container of the processing chamber 500 are opened and exposed to the atmosphere. In the embodiment, more than one chamber is disposed inside the outer chambers 511 and 512 that constitute the outer walls of the processing chamber 500, creating a multiple chamber structure in which a chamber is disposed inside another chamber.

According to the present embodiment, two chambers, an inner chamber and an outer chamber, are formed. The wafer holder 504 is disposed inside the inner chambers 509, 510, and the processing of the wafer is performed inside the innermost chamber. In order for the wafer being the object of processing to be mounted on the wafer holder 504 within the inner chambers 509, 510, a gate must be provided to the inner chamber 509 or inner chamber 510 through which the wafer is to be transferred. Further, a valve is required for opening and closing a communication path communicating the inside of the chamber with the outside space by opening or closing this gate in airtight manner.

The present embodiment comprises an atmospheric gate valve 514 for opening or closing the gate disposed between the inside of the processing chamber 500 and the inside of the transfer chamber 112 so as to realize the communication of the two chambers or to close the communication path therebetween in airtight manner, and a process gate valve 513 for opening or closing a path communicating the inside and the outside of the inner chamber 509 so as to realize the communication therebetween or to close the communication path in airtight manner. The atmospheric gate valve 514 is disposed on the side wall within a transfer chamber 112 and capable of being moved both in the vertical and horizontal directions by a drive means 522, thereby either opening or shutting and sealing a gate on the inner side wall.

Further, a gate is disposed on the exterior chamber 511 constituting the vacuum container, to the area corresponding to and communicating with the gate disposed on the transfer chamber 112 when the transfer chamber 112 and the processing chamber 500 are connected. The location of this gate is determined so as not to interfere with the transfer of the wafer or the movement of the robot arm when the wafer is transferred by the robot arm or wafer transfer device 506 within the transfer chamber 112. Moreover, when the inner chamber 509 is disposed within the outer chamber 511, a process gate is located so as to oppose to the gate on the outer chamber or the gate of the transfer chamber 112, and the wafer is transferred through this process gate.

Furthermore, a process gate valve 513 for opening and closing the process gate is located in a space interposed between the outer chamber 511 and the inner chamber 509, the process gate valve 514 capable of being moved both in vertical and horizontal directions via a driving means 521 disposed below the valve 514. In order to shut the gate, the valve is disposed on the side wall of the inner chamber 509 sealing the gate at the inner side of the side wall, and in order to open the gate, the valve is removed therefrom. The location and shape of the process gate is determined so as not to interfere with the wafer and the robot arm when the wafer is being transferred by the robot arm disposed within the transfer chamber. Further, the shape of the process gate is designed so that when the gate is closed by the process gate valve 513, the inner walls of inner chambers 509 and 510 do not become uneven.

According to the present arrangement, all the gate valves are opened when transferring wafers so as not to interfere with the transfer operation. Upon processing the wafer, the process gate valve 513 for closing the gate disposed on the innermost chamber, which according to the present embodiment is the inner chamber 509, and the atmospheric gate valve 514 disposed on the outer chamber 511 are closed and sealed airtightly, thereby shutting the communication between the inner space of the inner chambers 509 and 510, the inner space of the outer chambers 511, 512, and the inner space of the transfer chamber 112.

When detaching the processing chamber or when opening the vacuum container for maintenance and the like, the process gate valve 513 is opened while the atmospheric gate valve 514 is closed, so that the air of the inside and outside of the inner chamber 509 within the outer chamber 511 are communicated. At this time, a process gas valve 502 is operated to shut off a process gas line 501 so that process gas is not supplied to the processing chamber 500. As explained, by releasing the process gate valve 513, the inside and the outside of the inner chamber 509 within the outer chamber 511 are communicated so that their pressure is substantially equalized or controlled appropriately. The load received by the inner chamber 509 or 510 caused by the difference in pressure between the inside and outside of the chamber is minimized, and the required thickness and size of the components can thereby be reduced.

If the inside of the outer chamber 511 constituting the vacuum container of the processing chamber 500 must be subjected to maintenance, the atmospheric gate valve 514 is closed to seal the outer chamber 511, and then the process gate valve 513 is opened. When the process gate is released and the air inside and outside the inner chambers 509, 510 are in communication, an atmospheric release valve 515 is opened to let the inside air communicate with the outside air of the processing chamber 500, to thereby raise the pressure within the outside chamber 511 of the processing chamber 500 to substantially reach atmospheric pressure. In other words, the inside of the outside chamber 511 is exposed to the atmosphere. Thereafter, the inside of the processing chamber 500 is opened.

Next, a lid 503 disposed on the upper portion of the outer chamber 511 of the processing chamber 500 and sealing the chamber is lifted upward and opened. At this time, the lid 503 can be lifted up by a crane or the like, but it is also possible to provide a hinge portion in advance to a portion surrounding the lid 503, which enables the lid to be rotated via the hinge for 180 degrees or more toward the upper direction. Next, maintenance of the inner chamber 509 is carried out. In order to facilitate maintenance operations such as cleaning, replacing and repairing of parts, the inner chamber 509 can be detached from the outer chamber 511 and taken out from the processing chamber unit 500.

According to the present embodiment, the pressure inside and outside the inner chamber 509 can be substantially equalized and thus maintained, so the required thickness of the chamber member can be reduced. Therefore, the weight of the inner chamber 509 can be reduced and maintenance operation such as removal of the inner chamber from the processing chamber is facilitated, so that the work time can be cut down and the operation efficiency of the apparatus improved.

In the present embodiment, there are two inner chambers, one disposed above the other, the upper chamber 509 disposed above the block of the wafer holder 504 and the lower chamber 510 disposed below the block. The wafer holder 504 block is disposed below the inner chamber 509. The block of the wafer holder 504 is equipped with a wafer holder body 504 and support beams 520, the wafer holder being the center axis and support beams disposed axially around the axis. According to the present embodiment, the inner chamber 509, the outer chamber 511 and the wafer holder 504 have substantially cylindrical shapes, and the gas in the space above the wafer holder 504 within the inner chamber 509 flows downward via the spaces interposed between the support beams in the inner chamber 509.

The support beams 520 connect the wafer holder body 504 with a ring-shaped support base member 523 disposed around the body so as to support and fix the wafer holder 504 within the inner chamber 509. Gas and refrigerant supply pipes and power lines to the wafer holder 504 are disposed to the inside of the support base member 523, the support beams 520 and hanging beams 505 connected to the support base member 523 and suspending the same in position.

According to this arrangement, the wafer holder body 504, the support beams 520 and the support base 523 can be lifted up as one integrated block and taken out of the outer chamber 511. The maintenance of the wafer holder 504 is not performed as frequently as the maintenance of the inner chamber 509, so by forming the wafer holder and surrounding components as a single block that can be moved integrally, the efficiency of the maintenance operation of the apparatus is improved.

A lower inner chamber 510 is disposed below the block of the wafer holder 504, and an opening is provided to the lower center portion of the inner chamber 510. This opening is communicated with exhaust means comprising an exhaust valve 507 and an exhaust pump 508 disposed below the wafer holder 504 and at the bottom portion of the inner chamber 510, through which gas in the inner chamber 509 and flowing around the wafer holder 504 is flown. In other words, the space interposed between supporting beams 520 surrounding the wafer holder 504 and, the space within the inner chamber 510 disposed below the wafer holder 504 function as an exhaust path through which the process gas inside the processing chamber 500, particles of plasma and particles of reaction products are discharged.

The exhaust valve 507 acting as exhaust means for the processing chamber 500 is a shutter-type exhaust valve comprising plural plate shutters capable of blocking the communication between the space within the inner chamber 510 and the exhaust pump 508 disposed below the valve. Thus, according to the embodiment, the exhaust means is disposed below the wafer holder 504, preferably directly below the holder. The plasma, the process gas and the reaction products inside the space above the wafer holder 504 in the inner chamber 509 flow through the exhaust path extending via the space around the wafer holder 504 and inside the lower inner chamber 510 toward the exhaust valve 507.

The plural support beams 520 are disposed substantially axisymmetric around the center axis of the wafer holder 504. The support beams are designed so that the lengths of discharge routes extending through the spaces interposed between support beams and reaching the exhaust valve 507 directly below the wafer holder are substantially equal. Thus, the flow of gas, charged particles and reaction products existing in the plasma above the wafer holder becomes uniform with respect to the circumferential direction of the wafer holder and the substantially disc-shaped wafer mounted on the wafer holder, so that the distribution of particles of the substances within the plasma above the wafer becomes very even. As a result, the wafer processing becomes more uniform.

The exhaust means comprises an exhaust valve 507 with plural shutters and an exhaust pump 508 disposed underneath, wherein the exhaust valve 507 is disposed directly below the wafer holder 504. The plurality of plate-shaped shutters are disposed substantially horizontally as shown (in the direction of the wafer surface), each shutter capable of being rotated around a mounting axis to thereby adjust the area of the communication passage between the opening of the inner chamber 510 and the exhaust pump 508. By rotating the shutters via the axes, the plates of the shutters come into contact with each other, sealing the opening. When the plates of the shutters become substantially parallel in the upper direction (in the direction of the wafer holder 504), the area of communication becomes greatest. Though not shown, the exhaust valve 507 comprises a drive means such as a motor for controlling the rotation of the shutters, so the exhaust means can control the amount and rate of discharge by adjusting the opening area of these shutters and the operation of the exhaust pump 508.

Figure 7:
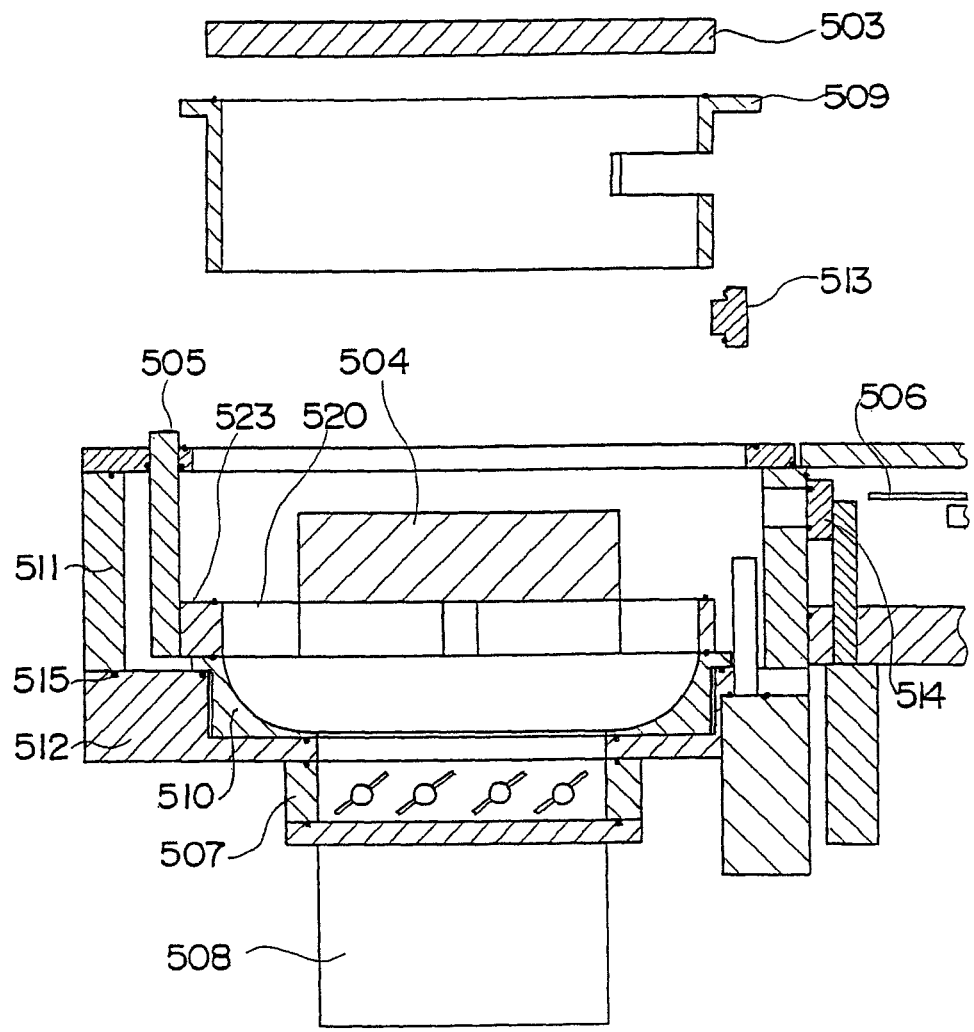
FIG. 7 is a vertical cross-sectional view explaining the removal of components from the processing chamber illustrated in FIG. 5.

FIG. 7 is used to explain the maintenance operation of the inside of the processing chamber 500. FIG. 7 is a vertical cross-sectional view explaining how the components of the processing chamber illustrated in FIG. 5 are detached.

After confirming that the pressure inside and outside the inner chamber 509 within the processing chamber 500 are substantially equal, the lid 503 is opened. A crane or the like can be used to lift the lid, or a hinge portion provided to the lid in advance can be used to open the lid via the hinge. From the outer chamber 511 exposed to the atmosphere, the upper inner chamber 509 is lifted up and removed. After either removing the process gate valve 513 from within the outer chamber 511 or by releasing the process gate valve 513 from the inner chamber 509, the inner chamber 509 is lifted up and taken out of the processing chamber 500. Thereafter, the process gate valve 513 is detached and taken out of the outer chamber 511.

Figure 8:
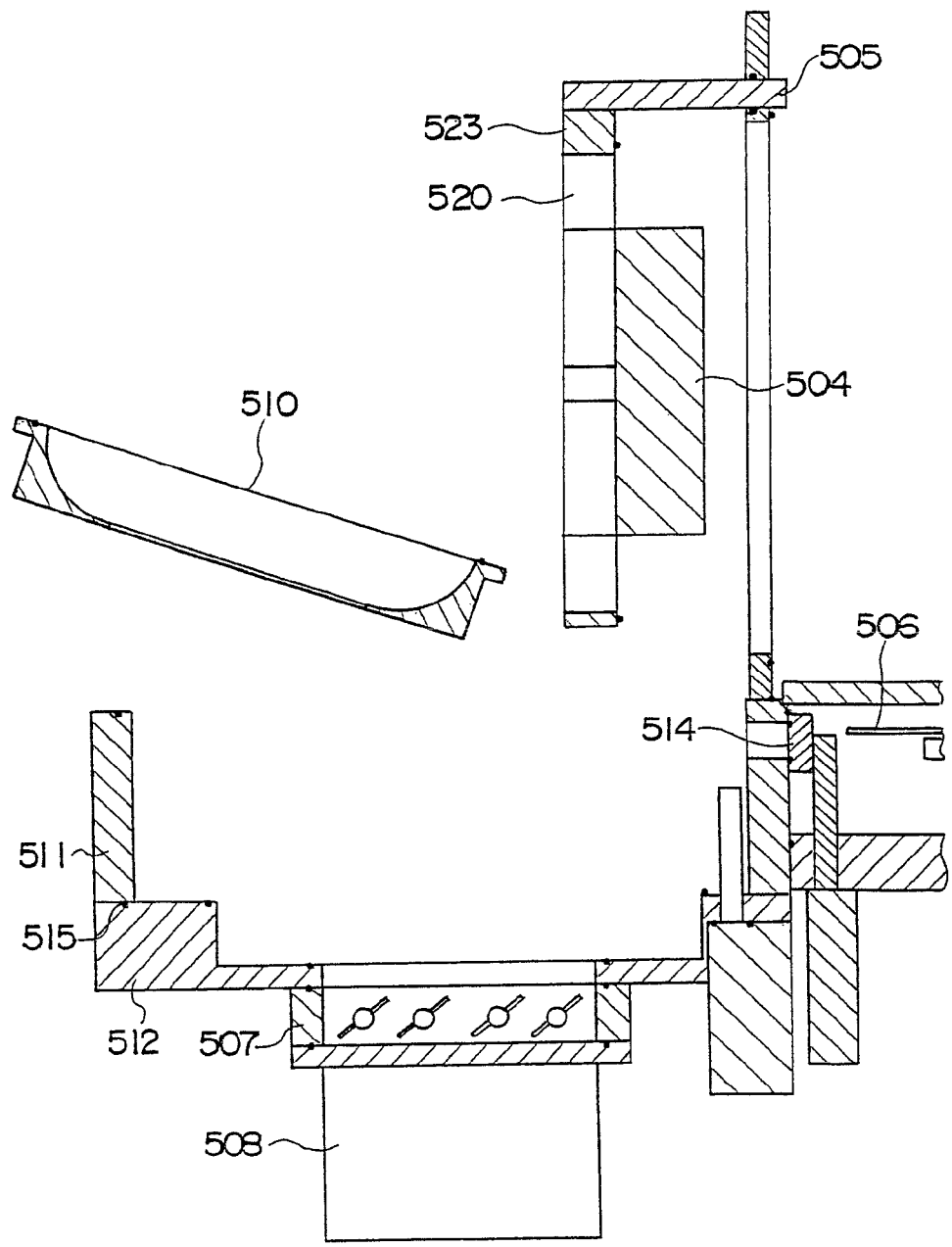
FIG. 8 is a vertical cross-sectional view explaining the removal of components from the processing chamber illustrated in FIG. 5.

The inner chambers 509 and 510 are disposed so that chamber 509 is located above chamber 510 and having interposed therebetween the support beams 520 and the support base member 523 of the wafer holder 504. After lifting the integral wafer holder 504 block out of the outer chamber 511, the lower inner chamber 510 is removed from above, and then maintenance such as cleaning and repairing is carried out to the inner side walls of the outer chamber 511. FIG. 8 is referred to in explaining this maintenance operation.

FIG. 8 is a vertical cross-sectional view explaining how the parts of the processing chamber illustrated in FIG. 5 is removed.

As explained, the upper inner chamber 509 is lifted and removed from the processing chamber, and then the wafer holder 504 block is lifted and moved out of the processing chamber 500.

This movement can either be realized by rotating the wafer holder block connected through a hanging beam 505 to an outer lid 503 via a hinge provided in advance to the outer lid 503, or by using a crane and the like to lift the wafer holder block. After taking out the wafer holder 504 block, the lower inner chamber 510 is removed. The upper and lower inner chambers 509 and 510 can be either subjected to maintenance operations such as cleaning and repairing, or replaced with new components. Similarly, the exhaust valve can be subjected to maintenance and replacement when necessary.

After completing the maintenance operation, the chamber is reassembled in the opposite order as explained above. Then, the lid 503 is attached to the processing chamber 500 before connecting various supply pipes and lines for gas, refrigerant and power.

As explained, according to the present embodiment, a process gate and a process gate valve for opening and closing the gate is disposed to the position opposing to the gate of the outer chamber within a multiple chamber arrangement. When the atmospheric gate valve disposed to the outer side is closed, the inner area of the processing chamber can be exposed to the atmosphere enabling the processing chamber or parts constituting the same to be removed and attached. Such maintenance (removal, reassembly etc.) of the processing chamber of a processing unit can be carried out while other processing units are carrying out processes.

According further to the present embodiment, the inside and outside pressures of the inner chamber can be equalized and maintained, enabling the thickness and thus the weight of the inner chamber to be reduced so that mounting and removing operations are facilitated and work efficiency is improved, and as a result, the overall operation efficiency of the apparatus is improved. Further, since the inner chamber is divided into upper and lower parts, the handling of the inner chamber is facilitated, the work time is reduced, and the operation efficiency of the apparatus is further improved. Since the wafer holder and surrounding parts can be handled as a single block of components, the components requiring less frequent maintenance can be removed as one so that the work efficiency is further enhanced.

Since the exhaust means is disposed below the wafer holder, especially directly under the wafer holder, the route for discharging particles of plasma etc. inside the processing chamber is kept relatively straight. Therefore, the discharge speed is increased, the work time is shortened and the overall operation efficiency of the apparatus is enhanced. Furthermore, by disposing an exhaust valve comprising plural shutters under the wafer holder, the buffer space for the exhaust below the wafer holder is minimized and the exhaust time is shortened. Since the support beams of the wafer holder are disposed substantially axisymmetricly around the wafer holder, the exhaust path extends relatively straightly toward the exhaust means disposed below the wafer holder.

Moreover, since the plural exhaust paths formed around the wafer holder have substantially equal lengths, the flow of particles of the plasma etc. in the processing chamber becomes uniform and the particle density above the wafer on the wafer holder becomes even, resulting in stable processing of the wafer.

What is claimed is:

1. A vacuum processing apparatus comprising:
   plural processing chambers, each processing chamber having a sample table disposed inside thereof which supports a sample to be processed, the sample being processed on the sample table in the processing chamber with a gas which is supplied thereto using a plasma generated in a depressurized space inside the processing chamber;
   a transfer chamber which has a polygonal planar shape and is coupled to the plural processing chambers with respect to at least one side of the polygonal shape, the transfer chamber enabling receipt of the sample and transfer of the sample to and from a respective one of the plural processing chamber under a vacuum pressure;
   a transfer robot disposed in the transfer chamber which transfers the sample held on an arm of the transfer robot between the processing chamber and the transfer chamber;
   a mass flow controller for supplying gas to the each of the plural processing chambers;
   a connector portion between the mass flow controller and a building in which the apparatus is installed for supplying utilities including at least one gas to the mass flow controller; and
   at least one of the plural processing chambers comprising:
   at least an upper member and a lower member, the lower member being disposed in a lower portion of the processing chamber;
   the upper member being disposed on an upper side with respect to the lower member, the upper member being configured as at least one member which is separate from the lower member and detachable from the lower member, at least the upper and lower members constituting the processing chamber;
   an exhaust opening disposed below the sample table through which the depressurized space inside of the processing chamber is exhausted;
   at least one of hanging beams disposed with respect to the processing chamber, an upper portion of the hanging beam being coupled to the upper member of the processing chamber and a lower portion of the hanging beam being coupled to the sample table, the hanging beams suspending the sample table above the exhaust opening inside the processing chamber; and
   a gate which is disposed between the processing chamber and the transfer chamber and communicating therebetween, the sample held on the arm of the transfer robot being transferred between the processing chamber and the transfer chamber through the gate;
   wherein the upper member coupled to the at least one of hanging beams is configured so as to be movable in an upper direction away from the lower member and rotatable around an end portion of a transfer chamber side of the upper member.

2. A vacuum processing apparatus according to claim 1, wherein the sample table has a cylindrical shape; and
   the processing chamber further comprises at least one of support beams which is disposed between a side portion of the sample table and a lower end portion of the one of the hanging beams, the support beams extending horizontally and connecting the one of the hanging beams and the sample table.

3. A vacuum processing apparatus according to claim 2, wherein an opening of the gate is disposed in the processing chamber and is located above an upper surface of the sample table on which the sample is located.

4. A vacuum processing apparatus according to claim 3, wherein the upper member of the processing chamber opens and closes the processing chamber, and enables air tight sealing inside of the processing chamber when the upper member closes the processing chamber.

5. A vacuum processing apparatus according to claim 4, wherein the hanging beams are disposed axisymmetrically around a center axis of the sample table in an outer peripheral space of the sample table.

6. A vacuum processing apparatus according to claim 3, wherein the hanging beams are disposed axisymmetrically around a center axis of the sample table in the outer peripheral space of the sample table.

7. A vacuum processing apparatus according to claim 2, wherein the hanging beams are disposed axisymmetrically around a center axis of the sample table in an outer peripheral space of the sample table.

8. A vacuum processing apparatus according to claim 1, wherein an opening of the gate is disposed in the processing chamber and is located above an upper surface of the sample table on which the sample is located.

9. A vacuum processing apparatus according to claim 8, wherein the upper member of the processing chamber opens and closes the processing chamber, and enables air tight sealing inside of the processing chamber when the upper member closes the processing chamber.

10. A vacuum processing apparatus according to claim 9, wherein the hanging beams are disposed axisymmetrically around a center axis of the sample table in an outer peripheral space of the sample table.

11. A vacuum processing apparatus according to claim 8, wherein the hanging beams are disposed axisymmetrically around a center axis of the sample table in the outer peripheral space of the sample table.

12. A vacuum processing apparatus according to claim 1, wherein the upper member of the processing chamber opens and closes the processing chamber, and enables air tight sealing inside of the processing chamber when the upper member closes the processing chamber.

13. A vacuum processing apparatus according to claim 12, wherein the hanging beams are disposed axisymmetrically around a center axis of the sample table in an outer peripheral space of the sample table.

14. A vacuum processing apparatus according to claim 1, wherein the upper member is configured so as to be rotatable around a hinge portion disposed on the upper member at the end portion of the transfer chamber side thereof.

15. A vacuum processing apparatus according to claim 1, wherein the hanging beams are disposed axisymmetrically around a center axis of the sample table in an outer peripheral space of the sample table.

* * * * *